US008425806B2

(12) United States Patent
Noyens et al.

(10) Patent No.: US 8,425,806 B2
(45) Date of Patent: Apr. 23, 2013

(54) SEMICONDUCTIVE POLYMER COMPOSITION

(75) Inventors: Koenraad Noyens, Geel (BE); Marc De Vleesschauer, Kontich (BE)

(73) Assignee: Borealis Technology OY, Porvoo (FI)

( * ) Notice: Subject to any disclaimer, the term of this patent is extended or adjusted under 35 U.S.C. 154(b) by 420 days.

(21) Appl. No.: 12/738,943

(22) PCT Filed: Oct. 22, 2008

(86) PCT No.: PCT/EP2008/008926
§ 371 (c)(1),
(2), (4) Date: Apr. 20, 2010

(87) PCT Pub. No.: WO2009/053042
PCT Pub. Date: Apr. 30, 2009

(65) Prior Publication Data
US 2010/0206607 A1 Aug. 19, 2010

(30) Foreign Application Priority Data
Oct. 23, 2007 (EP) .................................. 07020735

(51) Int. Cl.
*H01B 9/02* (2006.01)
(52) U.S. Cl.
USPC ..................................... 252/511; 174/102 SC
(58) Field of Classification Search ............... 252/511; 174/102 SC
See application file for complete search history.

(56) References Cited

U.S. PATENT DOCUMENTS

| 3,401,020 | A | 9/1968 | Kester et al. |
| 3,922,335 | A | 11/1975 | Jordan et al. |
| 4,286,023 | A | 8/1981 | Ongchin |
| 4,297,310 | A | 10/1981 | Akutsu et al. |
| 4,340,577 | A | 7/1982 | Sugawara et al. |
| 4,351,876 | A | 9/1982 | Doi et al. |
| 4,391,789 | A | 7/1983 | Estopinal |
| 4,397,981 | A | 8/1983 | Doi et al. |
| 4,413,066 | A | 11/1983 | Isaka et al. |
| 4,446,283 | A | 5/1984 | Doi et al. |
| 4,456,704 | A | 6/1984 | Fukumura et al. |
| 4,612,139 | A | 9/1986 | Kawasaki et al. |
| 4,702,860 | A | 10/1987 | Kinderov et al. |
| 5,556,697 | A | 9/1996 | Flenniken |
| 6,086,792 | A | 7/2000 | Reid et al. |
| 2001/0031823 | A1 | 10/2001 | Atchetee et al. |

FOREIGN PATENT DOCUMENTS

| EP | 0420271 A1 | 4/1991 |
| EP | 0517868 B1 | 11/1995 |
| EP | 0629222 B1 | 9/1999 |
| EP | 0736065 B1 | 2/2000 |
| EP | 1309631 B1 | 4/2005 |
| EP | 1309632 B1 | 4/2005 |
| EP | 1 548 752 A1 * | 6/2005 |
| EP | 1548752 A1 | 6/2005 |
| EP | 1695996 A1 | 8/2006 |
| WO | 9308222 | 4/1993 |
| WO | 0038895 | 7/2000 |
| WO | 0062014 | 10/2000 |
| WO | 2006131266 A1 | 12/2006 |

* cited by examiner

*Primary Examiner* — Robert D. Harlan
(74) *Attorney, Agent, or Firm* — The Webb Law Firm

(57) ABSTRACT

The present invention provides a semiconductive polymer composition having (a) from 30 to 90 wt % of a polymer component, (b) from 10 to 60 wt % of carbon black and (c) from 0 to 8 wt % additives, based on the total semiconductive polymer composition, and wherein the composition comprises less than 23 particles per $m^2$ having a width of larger than 150 μm at the half height of a particle protruding from the surface of the tape sample, less than 10 particles per $m^2$ having a width of larger than 200 μm at the half height of a particle protruding from the surface of the tape sample, and preferably, about 0 particles per $m^2$ having a width of larger than 500 μm at the half height of a particle protruding from the surface of the tape sample.

20 Claims, 1 Drawing Sheet

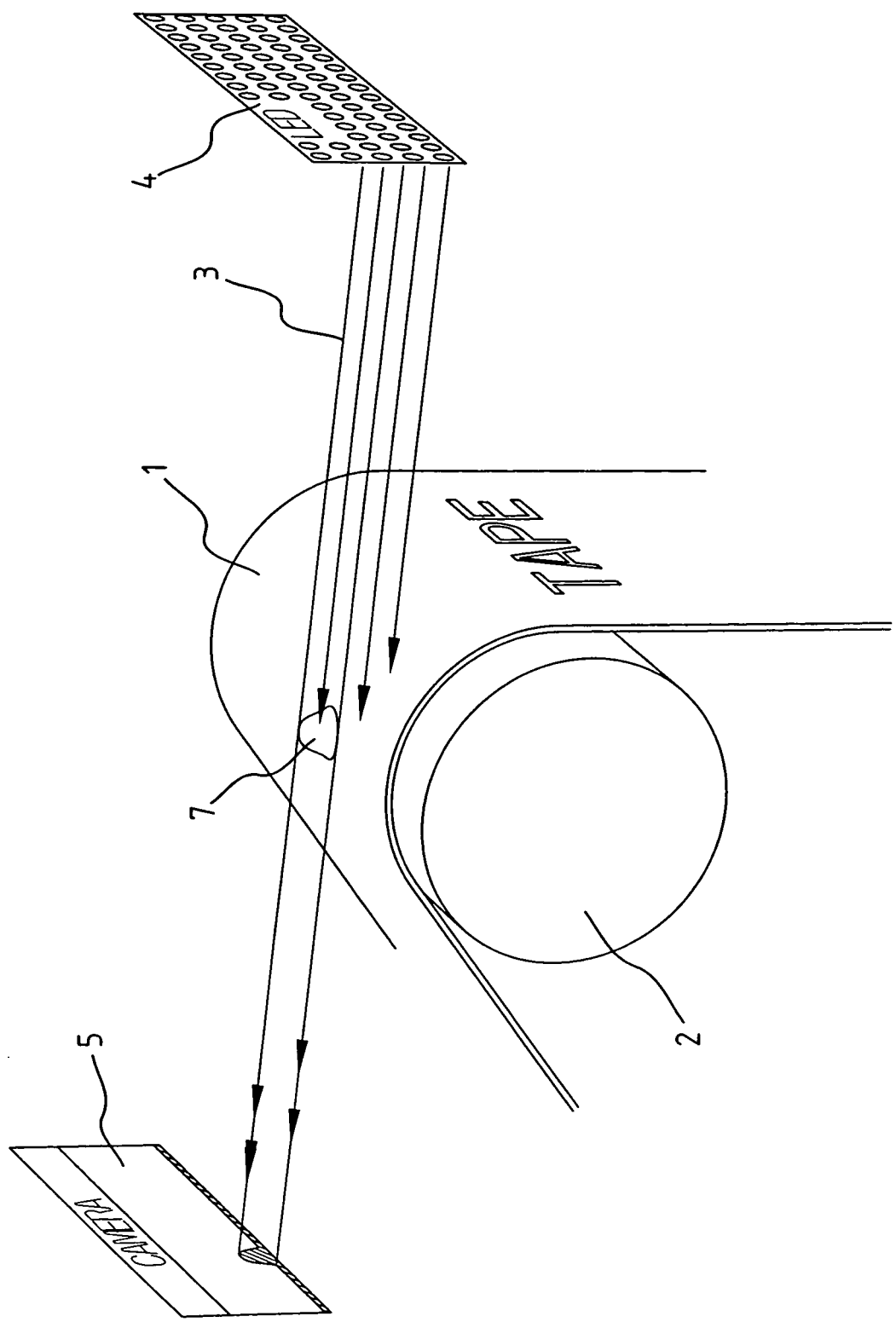

SEMICONDUCTIVE POLYMER COMPOSITION

BACKGROUND OF THE INVENTION

1. Field of the Invention

The present invention relates to a semiconductive polymer composition, to a method for preparing said semiconductive polymer composition, to its use for the production of a semiconductive layer of an electric power cable, and to an electric power cable comprising at least one semiconductive layer, which layer comprises the above mentioned semiconductive polymer composition.

2. Description of Related Art

In wire and cable applications a typical cable comprises at least one conductor surrounded by one or more layers of polymeric materials. In power cables, including medium voltage (MV), high voltage (HV) and extra high voltage (EHV), said conductor is surrounded by several layers including an inner semiconductive layer, an insulation layer and an outer semiconductive layer, in that order. The cables are commonly produced by extruding the layers on a conductor. Such polymeric semiconductive layers are well known and widely used in dielectric power cables rated for voltages greater than 1 kilo Volt. These layers are used to provide layers of intermediate resistivity between the conductor and the insulation, and between the insulation and the ground or neutral potential.

These compositions are usually prepared in granular or pellet form. Polyolefin formulations such as these are disclosed in U.S. Pat. Nos. 4,286,023; 4,612,139; and 5,556,697; and European Patent 420 271.

One or more of said layers of the power cable are typically crosslinked to achieve desired properties to the end product cable. Crosslinking of polymers, i.e. forming primarily inter-polymer crosslinks (bridges), is one well known modification method in many end applications of polymers. Crosslinking of polymers, such as polyolefins, substantially contributes i.a. to heat and deformation resistance, creep properties, mechanical strength, as well as to chemical and abrasion resistance of a polymer. In wire and cable applications crosslinked polymers, such as crosslinked polyethylenes, are commonly used as a layer material, e.g. in insulating, semiconducting and/or jacketing layers.

Crosslinking can be effected i.a. by radical reaction using radiation or free radical generating agents, also called crosslinking agents. Examples of such free radical generating agents are peroxides including inorganic and organic peroxides. Crosslinking using peroxide is known as peroxide technology. A further well known crosslinking method is crosslinking functional groups, e.g. by hydrolysing hydrolysable silane groups, which are linked to polymer, and subsequently condensing the formed silanol groups using a silanol condensation catalyst, for instance carboxylates of metals, such as tin, zinc, iron, lead and cobalt; organic bases; inorganic acids; and organic acids. The crosslinking of polymers via silane groups thereof is known as silane-crosslinking technology, and for hydrolysable silane groups also called as moisture curing technology. Such silane-crosslinking techniques are known e.g. from U.S. Pat. No. 4,413,066, U.S. Pat. No. 4,297,310, U.S. Pat. No. 4,351,876, U.S. Pat. No. 4,397,981, U.S. Pat. No. 4,446,283 and U.S. Pat. No. 4,456,704. These two type of crosslinking methods are referred herein below shortly as "crosslinking via radical reaction" and, respectively, "crosslinking via silane groups". In case of crosslinkable semiconductive layer materials using crosslinking via radical reaction, said layer composition may also comprise a crosslinking agent, such as peroxide, which is preferably added onto the pellets after producing the polymer pellets as described e.g in WO00038895 of Pirelli.

The purpose of a semiconductive layer is to prolong the service life, i.e. long term viability, of a power cable i.a. by preventing partial discharge at the interface of conductive and dielectric layers. Surface smoothness of the extruded semiconductive layer is also a property that plays also an important role in prolonging the surface life of the cable. The smoothness is influenced i.a. by the used carbon black (CB). I.a. an uneven distribution of the particle size of carbon black particles can adverse said surface smoothness and cause localised electrical stress concentration which is a defect that can initiate a phenomenon well known as vented trees. Moreover, i.a. the surface properties and particle size as such of the CB may affect the surface smoothness of the semiconductive layer of a power cable. E.g. it is known that the larger the CB particles, the smoother the surface of the semiconductive layer. However, increasing the particle size of a CB for improving smoothness in turn deteriorates, i.e increases, the resistivity of the semiconductive layer material, whereby these properties need often be balanced, especially in case of so called furnace carbon black.

Furnace carbon black is generally acknowledged term for the well known CB type that is produced in a furnace-type reactor by pyroliyzing a hydrocarbon feedstock with hot combustion gases. A variety of preparation methods thereof are known and such furnace carbon blacks are described i.a. in EP629222 of Cabot, U.S. Pat. No. 4,391,789, U.S. Pat. No. 3,922,335 and U.S. Pat. No. 3,401,020. Furnace carbon black is distinguished herein from acetylene carbon black which is also generally acknowledged term for the well known type of CB produced by reaction of acetylene and unsaturated hydrocarbons, e.g. as described in U.S. Pat. No. 4,340,577.

As an example of commercial furnace carbon black grades described in ASTM D 1765-98b are i.a. N351, N293 and N550.

Moreover, many carbon blacks, e.g. above mentioned furnace carbon blacks, are commercially available in a form of "pellet" agglomerates formed from primary CB particles thereof. These agglomerates are broken during the processing, i.e. compounding, step of the preparation of said semiconductive polymer composition. The break down of said agglomerates thus may also have an effect on said surface smoothness property. Without binding to any theory it appears that an extensive mixing of semiconductive polymer mixture in order to get an even particle size distribution amongst the CB particles may adverse the resistivity of the composition. Accordingly there seems to be limitations in particle size window for the CB particles to enable sufficient smoothness and resistivity of the final product.

Thus there is a continuous need in prior art to provide new semiconductive polymer compositions with improved smoothness and at the same time maintain feasible balance with other properties.

SUMMARY OF THE INVENTION

In view of the above it is an object of the present invention to provide a further semiconductive polymer composition which exhibit improved surface smoothness, which has good balance with other properties needed for a semiconductive polymer material.

BRIEF DESCRIPTION OF THE DRAWINGS

FIG. 1 is a schematic overview of a test apparatus for determining surface smoothness of semiconductive polymer materials.

DETAILED DESCRIPTION OF THE INVENTION

A first aspect of the present invention relates to a semiconductive polymer composition comprising:
(a) from 30 to 90 wt % of a polymer component,
(b) from 10 to 60 wt % of carbon black and
(c) from 0 to 8 wt % additives, based on the total semiconductive polymer composition, and wherein the composition comprises, when measured in accordance with the Surface Smoothness Analysis (SSA) method, using a tape sample consisting of said semiconductive polymer composition, as defined below under "Determination Methods", less than 23 particles per m$^2$ having a width of larger than 150 μm at the half height of said particle protruding from the surface of the tape sample, less than 10 particles per m$^2$ having a width of larger than 200 μm at the half height of said particle protruding from the surface of the tape sample, and preferably about 0 particles per m$^2$ having a width of larger than 500 μm at the half height of said particle protruding from the surface of the tape sample. The amount of the total polymer composition is 100 wt %.
Said Surface Smoothness Analysis (SSA) method using a tape sample consisting of said semiconductive polymer composition is as described below under "Determination Methods" and is a well known method used in the prior art for determining the surface smoothness of semiconductive polymer materials.

Typically, and preferably, said particles determined in the above SSA-method are carbon black particles.

Surprisingly, a semiconductive polymer composition has the claimed specific particle size distribution amongst particles present therein, which particle size distribution provides a markedly increased surface smoothness when used as a semiconductive layer material of a power cable, moreover, without sacrificing resistivity of said semiconductive layer material. Preferably, said semiconductive polymer composition of the invention has also good processability property and, also preferably, can be produced in an industrially feasible manner. The obtained excellent property balance of surface smoothness and resistivity that are achievable by the specific particle size distribution is unexpected in view of the prior art. Moreover, said semiconductive polymer composition with claimed particle size distribution is even obtainable using a furnace carbon black as the carbon black component (b).

It is preferred that the semiconductive composition comprises less than 20, more preferably less than 15, even more preferably less than 10, most preferably less than 8, per m$^2$ having a width of larger than 150 μm at the half height of said particle protruding from the surface of the tape sample. In very demanding end applications it may be even preferable that the semiconductive polymer composition of the invention has less than 5 particles per m$^2$ having a width of larger than 150 μm at the half height of said particle protruding from the surface of the tape sample.

Preferably, the semiconductive composition comprises less than 8, more preferably less than 5, most preferably less than 3 particles per m$^2$ having a width of larger than 200 μm at the half height of said particle protruding from the surface of the tape sample.

In a most preferred embodiment the semiconductive comprises less than 10, preferably less than 8, particles per m$^2$ having a width larger than 150 μm at the half height of said particle protruding from the surface of the tape sample and less than 5, such as less than 3, particles per m$^2$ having a width larger than 200 μm at the half height of said particle protruding from the surface of the tape sample.

The amount of carbon black (b) of said semiconductive polymer composition is up to 60 wt %, suitably of from 10 to 50 wt %, preferably of from 20 to 45, more preferably of from 30 to 40 wt %, more preferably of from 35 to 40 wt %.

The preferred carbon black (b) has one or more, in any combination, or preferably all the following properties. Naturally the properties, e.g. mean primary particle size, as given below thus characterise the carbon black component (b) as such before it is combined with the polymer component (a) for providing the polymer composition of the invention, i.e. are e.g. given by a supplier in case of a commercial carbon black. The carbon black (b) can thus be e.g. a commercial carbon black or can be produced by a conventional process.

Preferably, the carbon black (b) has a STSA value "STSA of less than 400 m$^2$/g, suitably of more than 30, preferably of 40 to 300 m$^2$/g, more preferably of 50 to 230 m$^2$/g, more preferably of 60 to 250 m$^2$/g, even more preferably of 75 to 210 m$^2$/g, or, depending on the embodiment, even as specific range as of 85 to 150 m$^2$/g may be desirable". STSA, Statistical Surface Area, is a measure of External surface area by multipoint nitrogen absorption and measured according to ASTM D5816-96, which corresponds to and replaces the earlier used CTAB method according to ASTM D3765-98.

Said CB (b) is preferably furnace carbon black as defined above. Further preferably, the semiconductive polymer composition of the invention can comprise said carbon black (b) component which is a commercial furnace carbon black which is typically supplied in the form of pellets, i.e. agglomerates of primary particles. Preferably at least 50 wt % of said pellets have an average pellet size of 0.250-0.500 μm. The size range can be defined using the respective mesh sieving classification of particle size, as known in the art. Such commercial carbon blacks in pellet form are typically supplied due i.a. handling reasons. The primary carbon black particles which form such agglomerates have typically a mean primary particle size of from 5 to 70 nm, preferably of from 10 to 35 nm, such as of from 10 to 25 nm, when measured in accordance with ASTM D3849-95a. In some embodiments even 23 nm or lower is the preferred range for the mean primary particle size. The mean primary particle size is defined as the number average particle diameter according to the ASTM D3849-95a. Unexpectedly the advantageous balance between surface smoothness and conductivity (resisitivity) of the polymer composition of the invention is present even when the (b) carbon black has smaller particle size. Moreover, such compositions are still feasible to process to a cable layer(s)

Preferred carbon black as said component (b) of the invention has a tinting strength measured in accordance with ASTM D 3265-97 of from 30 to 100%, preferably of from 50 to 100%, more preferably of from 80% to 100%, and even more preferably of from 85% to 98%. Further the carbon black (b) has an iodine adsorption number of up to 300 g/kg, preferably from 130 to 180 g/kg, when measured in accordance with ASTM D 1510-98 and a Oil Absorption number of up to 300 cm$^3$/100 g, preferably of from 90 and 130 cm$^3$/100 g, when measured in accordance with ASTM D 2414.

In a most preferred embodiment of the semiconductive polymer composition of the invention the carbon black (CB) (b) component is a well known furnace carbon black, for reasons that a very good surface smoothness is now obtained at relatively low costs. As mentioned above such furnace carbon black is generally known type of CB and generally acknowledged term to differentiate this CB type from i.a. acetylene carbon blacks, such as Denka black, supplied by Denka, that is produced using a different process. References of both types are given above in relation to back ground art.

As the polymer component (a), any commercial polymer or a polymer obtainable by a commercial polymerization process can be used in the polymer composition of the invention. The amount of said polymer component (a) of said semiconductive polymer composition of the invention is preferably of from 40 to 75 wt %, more preferably of from 50 to 70 wt %. Said polymer component (a) of said semiconductive polymer composition is preferably a polyolefin, more preferably a polymer of an alpha-olefin which includes a homopolymer of ethylene or copolymer of ethylene with one or more comonomers, which is selected from a branched polyethylene homo- or copolymer produced at high pressure by free radical initiated polymerisation (referred to as high pressure radical polymerization) and well known as low density polyethylene (LDPE) homopolymer, or copolymer, which is referred herein as LDPE homo- or copolymer, or a linear polyethylene homo- or copolymer produced by low pressure polymerisation using a coordination catalyst, such as well known linear very low density polyethylene (VLDPE), linear low density polyethylene (LLDPE), medium density polyethylene (MDPE) or high density polyethylene (HDPE), which is referred herein as "linear PE homo- or copolymer", or a mixture of such polymers The polyethylene as defined above suitable as said polymer component (a) can be said linear PE homo- or copolymer, which is preferably VLDPE, LLDPE, MDPE or HDPE polymer. They can be produced in a known manner in a single or multistage processes e.g. as slurry polymerisation, a solution polymerisation, a gas phase polymerisation, and in case of multistage process in any combination(s) thereof, in any order, using one or more of e.g. Ziegler-Natta catalysts, single site catalysts, including metallocenes and non-metallocenes, and Cr-catalysts. The preparation of linear ethylene polymer is and the used catalysts are very well known in the field, and as an example only, reference is made i.a. to a multistage process described in EP517868.

The preferred polymer component (a) of the invention is said polyethylene as defined above and is more preferably said LDPE homo or copolymer which may optionally have an unsaturation that can preferably be provided by copolymerising ethylene with at least one polyunsaturated comonomer as defined above and/or by using a chain transfer agent, such as propylene. Such polymer are well known and described e.g. in WO 93/08222, EP1695996 or WO2006/131266. Typically said unsaturated polyolefins have a double bond content of more than 0.1 double bonds/1000 C-atoms.

Further, the LDPE homo or copolymer subgroup of said preferred ethylene polymers is more preferably an LDPE copolymer of ethylene with one or more comonomers which are preferably selected from:
  $C_3$ or higher olefin comonomer(s), preferably ($C_3$-$C_{30}$) alpha-olefin comonomer(s), more preferably ($C_3$-$C_{12}$) alpha-olefin comonomer(s);
  polar comonomer(s),
  silane comonomer(s) or
  polyunsaturated comonomer(s), e.g. a comonomer with at least two double bonds, such as diene comonomers;
or a mixture of the above mentioned comonomers, and which LDPE copolymer may optionally have a further unsaturation provided by using a chain transfer agent, such as propylene, and which LDPE copolymer is referred herein as LDPE copolymer. The comonomers mentioned above, as well as chain transfer agents are well known in the art. The polar groups of said polar comonomer are preferably selected from siloxane, amide, anhydride, carboxylic, carbonyl, hydroxyl, ester and epoxy groups.

Most preferred polymer component (a) of said semiconductive polymer composition is said LDPE copolymer, more preferably is a LDPE copolymer, wherein the comonomer is selected from one or more of polar comonomer(s) and may optionally comprise an unsaturation provided preferably by copolymerising ethylene with at least one polyunsaturated comonomer(s) and/or by using a chain transfer agent, such as propylene, as defined above, which LDPE copolymer is referred herein as LDPE copolymer of ethylene with at least polar comonomer(s), and is most preferably an LDPE copolymer of ethylene and at least polar comonomer(s). More preferably, said polar comonomer(s) in said LDPE copolymer of ethylene with at least polar comonomer(s) for said semiconductive polymer composition is/are selected from:
  vinyl carboxylate esters, such as vinyl acetate and vinyl pivalate,
  (meth)acrylates, such as methyl(meth)acrylate, ethyl (meth)acrylate, butyl(meth)acrylate and hydroxyethyl (meth)acrylate,
  olefinically unsaturated carboxylic acids, such as (meth)acrylic acid, maleic acid and fumaric acid,
  (meth)acrylic acid derivatives, such as (meth)acrylonitrile and (meth)acrylic amide,
  vinyl ethers, such as vinyl methyl ether and vinyl phenyl ether.

More preferably, said LDPE copolymer of ethylene with at least polar comonomer(s) is a LDPE copolymer of ethylene with one or more of vinyl esters of monocarboxylic acids having 1 to 4 carbon atoms, such as vinyl acetate, or of (meth)acrylates of alcohols having 1 to 4 carbon atoms, or of a mixture thereof, preferably of vinyl acetate, methyl(meth)acrylate, ethyl(meth)acrylate or butyl(meth)acrylate. The preferred subgroup of said LDPE copolymer of ethylene with at least polar comonomer(s) is a LDPE copolymer of ethylene with at least vinyl acetate, LDPE copolymer of ethylene with at least methyl acrylate, a LDPE copolymer of ethylene with at least ethyl acrylate or a LDPE copolymer of ethylene with at least butyl acrylate, or any mixture thereof.

The term "(meth)acrylic acid" and "(meth)acrylate" are intended to embrace both acrylic acid and methacrylic acid and, respectively "methacrylate" and "acrylate".

The content of polar comonomer in said LDPE copolymer of ethylene with at least polar comonomer(s) as defined above, that is most preferable as said polymer component (a) is not limited and may be of up to 70 wt %, preferably of 0.5 to 35 wt %, more preferably of 1.0 to 35 wt %, of the total amount of said LDPE copolymer.

High pressure polymerisation for producing said LDPE homo or copolymer and the subgroups as defined above, is a well known technology in the polymer field and can be effected in a tubular or an autoclave reactor, preferably, in a tubular reactor. The high pressure polymerisation is carried out suitably in a known manner, e.g. at temperature range from 80 to 350° C. and pressure of from 100 to 400 MPa typically in the presence of an initiator of the free radical/polymerisation reaction. Further details about high pressure radical polymerisation are given in WO 93/08222. The polymerisation of the high pressure process is generally performed at pressures of from 1200 to 3500 bar and temperatures of from 150 to 350° C.

$MFR_2$, of said polymer composition may typically be at least 0.01 g/10 min, suitably at least 0.5 g/10 min, preferably at least 1.0 g/10 min, more preferably at least 2.0 g/10 min, even more preferably at least 3.0 g/10 min, when measured according to ISO1133, 2.16 kg load, 190° C. The upper limit $MFR_2$ of said polymer composition is not limited and may be e.g. up 50 g/10 min, such as up to 30 g/10 min, preferably up to 20 g/10 min, more preferably up to 15 g/10 min, when determined as defined above.

It is preferred that said semiconductive polymer composition of the invention is in the form of polymer powder or, preferably, of pellets. The term pellets include herein granules and pellets of any shape and type and are very well known and can be produced in known manner using the conventional pelletising equipment.

In a further preferred embodiment the semiconductive polymer composition is cross-linkable via radical reaction or crosslinking via silane groups.

In case of said semiconductive polymer composition is crosslinkable via silane groups said silane groups can be introduced into the polymer structure 1) by copolymerisation of monomers, such as olefin monomers, with silane-moiety bearing comonomers, or 2) by grafting crosslinkable silane-moieties bearing compounds, such as unsaturated silane compounds with hydrolysable silane group(s), onto a polymer. Both methods are well known in the art. Grafting is usually performed by radical reaction using free radical generating agents. Both for copolymerisation and for grafting methods an unsaturated silane compound which is represented by the formula $RSiR'_nY_{3-n}$ wherein R is an ethylenically unsaturated hydrocarbyl or hydrocarbyloxy group, R' is an aliphatic, saturated hydrocarbyl group, Y is a hydrolysable organic group, and n is 0, 1 or 2. If there is more than one Y group, these groups do not have to be identical. Special examples of the unsaturated silane compound are those wherein R is vinyl, allyl, isopropenyl, butenyl, cyclohexenyl or gamma-(meth)acryloxypropyl, Y is methoxy, ethoxy, formyloxy, acetoxy, propionyloxy or an alkyl or arylamino group, and R' is a methyl, ethyl, propyl, decyl or phenyl group.

An especially preferred unsaturated silane compound is represented by the formula $CH2=CHSi(OA)_3$, wherein A is a hydrocarbyl group having 1-8 carbon atoms, preferably 1-4 carbon atoms. The most preferred compounds are vinyltrimethoxy silane, vinyl dimethoxyethoxy silane, vinyltriethoxy silane, gamma-(meth)acryloxypropyl silane, and vinyltriacetoxy silane.

Preferred crosslinkable semiconductive polymer composition of the invention is crosslinkable via radical reaction, whereby said the semiconductive polymer composition comprises a cross-linking agent, preferably peroxide which preferably constitutes between 0-8 wt %, preferably of from 0.1 to 5 wt %, of the semiconductive polymer composition. Preferred peroxides used for cross-linking are di-tert-amylperoxide, 2,5-di(tert-butylperoxy)-2,5-dimethyl-3-hexyne, 2,5-di(tert-butylperoxy)-2,5-dimethylhexane, tert-butylcumylper-oxide, di(tert-butyl)peroxide, dicumylperoxide, di(tert-butylperoxy-isopropyl)benzene, butyl-4,4-bis(tert-butylperoxy)valerate, 1,1-bis(tert-butylperoxy)-3,3,5-trimethylcyclohexane, tert-butylperoxybenzoate, dibenzoylperoxide. Further, the addition of the cross-linking agent is preferably effected after an optional subsequent process step of pellet formation, as described further below.

Said semiconductive polymer composition may comprise further components, typically additives, such as antioxidants, crosslinking boosters, scorch retardants, processing aids, fillers, coupling agents, ultraviolet absorbers, stabilizers, antistatic agents, nucleating agents, slip agents, plasticizers, lubricants, viscosity control agents, tackifiers, anti-blocking agents, surfactants, extender oils, acid scavengers and/or metal deactivators.

Examples of such antioxidants are as follows, but are not limited to: hindered phenols such as tetrakis[methylene(3,5-di-tert-butyl-4-hydroxyhydro-cinnamate)]methane; bis[(beta-(3,5-ditert-butyl-4-hydroxybenzyl)-methylcarboxyethyl)]sulphide, 4,4'-thiobis(2-methyl-6-tert-butylphenol), 4,4'-thiobis(2-tert-butyl-5-methylphenol), 2,2'-thiobis(4-methyl-6-tert-butylphenol), and thiodiethylene bis(3,5-di-tert-butyl-4-hydroxy)hydrocinnamate; phosphites and phosphonites such as tris(2,4-di-tert-butylphenyl)phosphite and di-tert-butylphenyl-phosphonite; thio compounds such as dilaurylthiodipropionate, dimyristylthiodipropionate, and distearylthiodipropionate; various siloxanes; polymerized 2,2,4-trimethyl-1,2-dihydroquinoline, n,n'-bis(1,4-dimethylpentyl-p-phenylenediamine), alkylated diphenylamines, 4,4'-bis(alpha,alpha-demthylbenzyl)diphenylamine, diphenyl-p-phenylenediamine, mixed di-aryl-p-phenylenediamines, and other hindered amine antidegradants or stabilizers. Antioxidants can be used in amounts of about 0.1 to about 5 percent by weight based on the weight of the composition.

In the preferred embodiment of the semiconductive polymer composition of the invention the carbon black (b) is a furnace carbon black. In this embodiment it is also preferable that the polymer component (a) is as defined above including the preferable subgroups thereof.

In a most preferred embodiment the semiconductive polymer composition comprises less than 10 particles having a width of larger than 150 μm at the half height of said particle protruding from the surface of the tape sample;

less than 5 particles per $m^2$ having a width of larger than 200 μm at the half height of said particle protruding from the surface of the tape sample about 0 particles per $m^2$ having a width of larger than 500 μm at the half height of said particle protruding from the surface of the tape sample and wherein the carbon black is preferably furnace carbon black and the polymer component is preferably a homo- or copolymer of polyethylene. The furnace carbon black used in this embodiment as carbon black (b) component has preferably one or more, in any combination, or preferably all the preferable properties as defined above.

The polymer composition of the invention may comprise further components, e.g. additives and/or further polymer components. Examples of further fillers as additives are as follows: clays, precipitated silica and silicates, fumed silica, calcium carbonate, ground minerals, and further carbon blacks. Fillers can be used in amounts ranging from less than about 0.01 to more than about 50 percent by weight based on the weight of the composition.

A second aspect of the present invention relates to a process for preparing a semiconductive polymer composition comprising the steps of:

i) introducing 30-90 wt % of a polymer component and 0-8 wt % additives in a mixer device and mixing the polymer component and additives at elevated temperature such that a polymer melt is obtained;

ii) adding 10-60 wt % of carbon black to the polymer melt and further mixing of the polymer melt such that the polymer composition comprises, when measured in accordance with the Surface Smoothness Analysis (SSA) method as defined under "Determination Methods" and using a tape sample consisting of said semiconductive polymer composition, less than 23 particles per m$^2$ having a width of larger than 150 μm at the half height of said particle protruding from the surface of the tape sample, less than 10 particles per m$^2$ having a width of larger than 200 μm at the half height of said particle protruding from the surface of the tape sample, and preferably about 0 particles per m$^2$ having a width larger than 500 μm at the half height of said particle protruding from the surface of the tape sample.

Preferably, the carbon black is added to the polymer melt in at least two subsequent addition steps. It is even more preferred when in the first addition step at least ⅔ of the total amount of carbon black is added to the melt, and in the second addition step the remainder of the total amount of carbon black is added to the melt. By carrying out the method according to the invention in this way, a very advantageous particle size distribution and mixing of the carbon black in the polymer mixture is obtained.

It is preferred when the semiconductive composition, depending on the desired end application, comprises less than 20, more preferably less than 15, even more preferably less than 10, most preferably less than 8, and in very demanding end applications even less than 5, particles per m$^2$ having a width larger than 150 μm at the half height of said particle protruding from the surface of the tape sample.

Preferably, the semiconductive composition comprises less than 8, more preferably less than 5, most preferably less than 3 particles per m$^2$ having a width larger than 200 μm at the half height of said particle protruding from the surface of the tape sample.

In a most preferred embodiment the semiconductive comprises less than 10 particles per m$^2$ having a width larger than 150 μm at the half height of said particle protruding from the surface of the tape sample and less than 5 (such as less than 3) particles per m$^2$ having a width larger than 200 μm at the half height of said particle protruding from the surface of the tape sample. In this case the carbon black is preferably furnace carbon black and the polymer component is preferably a homo- or copolymer of polyethylene.

In this regard it is further noted that in the method according to the invention the carbon black, the polymer component and the additives may be, and most preferably are, as have been described above in relation to the polymer composition.

The mixing after introducing the polymer component (a) and optional additives in the preparation process is effected at elevated temperature and results typically in melt mixing, typically more than 10° C. above, preferably more than 25° C., above the melting point of the polymer component(s) and below the undesired degradation temperature of the components, preferably below 250° C., more preferably below 220° C., more preferably of from 155 to 210° C., depending on the used polymer material.

Preferably said preparation process of the invention further comprises a step of pelletising the obtained polymer mixture. Pelletsing can be effected in well known manner using a conventional pelletising equipment, such as preferably conventional pelletising extruder which is integrated to said mixer device.

The process of the invention can be operated in batch wise or in continuous manner.

Apparatuses used for carrying out the method of the invention are for example single screw or twin screw mixer or a kneading extruder, or a combination thereof, which is preferably integrated to a pelletising device. The apparatus(es) may be operated in batch wise or, preferably, in continuous manner. The process may comprise a further subsequent sieving step before preferable pelletising step which is also conventionally used in the prior art in the preparation of semiconductive polymer compositions to limit the number of large particles. Said sieving step has normally no or minor effect on particle size distribution as now provided by the present invention.

A third aspect of the present invention relates to a semiconductive polymer composition or pellets thereof which can be obtained by the method as described above.

A fourth aspect of the invention relates to the use of the semiconductive polymer or its pellets for the production of a semiconductive layer of an electric power cable.

A further aspect of the present invention relates to an electric power cable comprising at least one semiconductive layer, which layer comprises a semiconductive polymer composition as described above.

Preferably, the power cable may comprise a conductor, an inner semiconductive layer (a), an insulation layer (b) and an outer semiconductive layer (c), each coated on the conductor in this order, wherein at least one of the inner and outer semiconductive layer(s) (a; c) comprises a semiconductive polyolefin composition according to the present invention as described above.

In a further preferred embodiment of the inventive power cable both the inner (a) and outer (c) semiconductive layers, comprise, more preferably consist of, the semiconductive polyolefin composition according to the present invention.

In a further preferable embodiment, at least one of the inner and outer semiconductive layers (a; c) is crosslinkable, preferably both inner (a) and outer (c) semiconductive layers are crosslinkable.

According to another embodiment of the inventive power cable the outer semiconductive layer (c) may be strippable or non-strippable, preferably non-strippable, i.e. bonded. These terms are known and describe the peeling property of the layer, which may be desired or not depending on the end application. In case of strippable semiconductive layer, the polymer (a) of the invention is more polar having the content of polar comonomers of at least 20.0 wt %, such as at least 25.0 wt %, preferably at least 26.0 wt % more preferably from 27.0 to 35.0 wt %, based on said polymer (a), and may contain further polar polymer components to contribute the strippability. Preferably the outer semiconductive, if present, is non-strippable and has a content of polar comonomers of less than 25.0 wt %, preferably less than 20.0 wt %, more preferable of from 10.0 to 18.0 wt %. In some embodiments the polar comonomer content as low as of 6.0 to 15.0 wt % based on said polymer (a) may be desired. In both strippable and non-strippable cases the layer is preferably crosslinkable.

The insulation layer (b) is well known in power cable field and can comprise any polymeric material suitable and/or conventionally used for such insulation layer. Also the insulation layer (b) is preferably crosslinkable.

Accordingly, the invention also provides a process for producing a power cable, wherein the process comprises blending the semiconductive polyolefin composition of the invention as defined above including any subgroups thereof, optionally with other polymer components and optionally with additives, above the melting point of at least the major polymer component(s) of the obtained mixture, and extruding the obtained melt mixture on a conductor for forming at least one semiconductive polymer layer on a conductor for a power cable. The processing temperatures and devices are well known in the art. Preferably, said polyolefin composition of the invention is used in form of pellets which are added to the mixing step and melt mixed.

Preferably, the semiconductive polyolefin composition is co-extruded on the conductor together with one or more further cable layer(s) forming polymeric composition(s), thus providing a multilayered power cable, preferably a multilayered power cable as defined above. After providing the layered power cable structure, preferably the multilayered power cable as defined above, the obtained cable is then crosslinked in the subsequent crosslinking step, i.e. said cable preparation process comprises a further step of crosslinking the obtained power cable as defined above, by contacting said at least one semiconductive layer which comprises said semiconductive polymer composition as defined above and which layer is crosslinkable, with a crosslinking agent, which is preferably a silanol condensation catalyst, in the presence of water in case of crosslinking via silane groups, or with a crosslinking agent which is preferably a peroxide in case of preferable crosslinking via radical reaction. Preferably, said at least one semiconductive cable layer is crosslinked during the preparation process of said cable via radical reaction using a peroxide as the crosslinking agent.

Such crosslinking step is preferably effected as an integrated subsequent step of the cable preparation process in a crosslinking zone. Preferred peroxide-crosslinking can be effected at the temperature to at least above 160 preferably above 170° C., as well known. The crosslinked cable is then recovered and further processed if needed.

In the alternative crosslinking via silane groups said layers comprising said semiconductive polymer composition of the invention are preferably crosslinked using a silanol-condensation catalyst which is preferably selected from carboxylates of metals, such as tin, zinc, iron, lead and cobalt; from organic bases; from inorganic acids; and from organic acids; more preferably from carboxylates of metals, such as tin, zinc, iron, lead and cobalt, or from organic acids, preferably from an organic sulphonic acid having a formula $$Ar(SO_3F)_x \quad (II)$$

wherein Ar is an aryl group which may be substituted or non-substituted, and x being at least 1, or a precursor of the sulphonic acid of formula (II) including an acid anhydride thereof or a sulphonic acid of formula (II) that has been provided with a hydrolysable protective group(s), e.g. an acetyl group that is removable by hydrolysis. Such organic sulphonic acids are described e.g. in EP736065, or alternatively, in EP 1 309 631 and EP 1 309 632.

The crosslinking via silane groups is effected in an elevated temperature, typically of below 100° C., preferably of below 80° C., more preferably of between 60 to 80° C. If said preferable silanol condensation catalyst as defined above is used, the said crosslinking step is carried out in the presence of liquid water or steam, i.e. water vapour, or both, preferably at least water vapour, as well known in the art. Said silane-crosslinking can be effected in a conventional manner using a conventional equipment.

Preferred crosslinking of cable is crosslinking via radical reaction using a peroxide as defined earlier above.

Thus also said crosslinked cables obtainable by the above crosslinking method via silane groups or, preferably via radical reaction, are also provided.

Determination Methods

If not already specified in the above general description the properties as defined above, in below examples and claims where analysed using the following methods.

Wt %=weight percent

MFR$_2$ was measured according to ISO1133, 2.16 kg load, at 190° C. for polyethylene.

Comonomer Content (NMR): Comonomer content was based on the polymerisable comonomer units and was determined by using $^{13}$C-NMR. The $^{13}$C-NMR spectra were recorded on Bruker 400 MHz spectrometer at 130° C. from samples dissolved in 1,2,4-trichlorobenzene/benzene-d6 (90/10 w/w).

In an alternative and comparable method for Comonomer content (wt %): was determined in a known manner based on Fourier transform infrared spectroscopy (FTIR) determination calibrated with $^{13}$C-NMR. The peak for the comonomer was compared to the peak of polyethylene (e.g. the peak for butyl acrylate at 3450 cm$^{-1}$ was compared to the peak of polyethylene at 2020 cm$^{-1}$ and the peak for silane at 945 was compared to the peak of polyethylene at 2665 cm$^{-1}$. The calibration with $^{13}$C-NMR is effected in a conventional manner which is well documented in the literature. The weight-% was converted to mol-% by calculation.

Surface Smoothness Analysis (SSA) Method

The general definitions for the surface smoothness properties of the semiconductive polymer composition of the invention as given above and below in the claims, as well as given in the examples below were determined using the sample and determination method as described below.

For illustrative purposes a schematic overview of the test apparatus is provided in FIG. 1. Herein, a tape 1 consisting of the semiconductive polymer composition passes over a rod 2 at a given speed and a light beam 3 coming from the light source 4 passes over the tape 1 and this light beam 3 is captured by the camera 5. When there is a particle 7 protruding from the surface of the tape 1, the light beam 3 will be altered, which alteration will be recorded by the camera 5. From this recording by the camera 5 it is possible to calculate the height and the width of the particle protruding from the surface of the tape. This way the amount, height and width of the particles present in the tape can be measured.

This method is used to determine the surface smoothness, i.e. the particles protruding outwards from the surface and thus causing the roughness of the tape surface. It indicates the smoothness of a polymer layer on a cable produced by (co) extrusion. The method detects and measures the width of a protruding particle at the half height of said protrusion thereof from the surface of the tape. The test system is further generally described e.g. in WO0062014 of Semyre.

Tape Sample Preparation

About 4 kg of pellets of a semiconductive polymeric composition were taken and extruded into a form of tape sample using Collin single screw of 20 mm and 25D extruder (supplier Collin) and following temperature settings at different sections, starting from the inlet of the extruder: 95° C., 120° C., 120° C. and 125° C. to obtain a temperature of 125° C. of the polymer melt. The pressure before the extrusion plate is typically 260 Bar, residence time is kept between 1 and 3 minutes and typical screw speed is 50 rpm, depending on the polymer material as known for a skilled person.

Extruder die opening: 30 mm×1 mm

Thickness of the tape: 500±20 μm

Width of the tape: 18 mm

The tape is cooled with air to solidify it completely before subjecting to a camera-scanning (detection) zone of the SSA-instrument which locates at a distance of 50 cm from the outlet of die.

The measurement area: Camera of SSA-instrument scans the tape surface while the tape moves with a given speed. The scanning width is set to exclude the edge area of the tape. The scanning is effected on along the tape to correspond to a measurement area of 1 m². Further details are given below.

SSA Determination of the Tape Sample

The test is based on an optical inspection of the obtained extruded tape that is passed in front of an optical scanner able to scan even a large surface at high speed and with good resolution. The SSA-instrument is fully computerised and during the operation it automatically stores information about positions and sizes of pips found for statistical evaluation. "Pip" means herein a smaller burl with a height at least one order of magnitude higher than the surrounding background roughness. It is standing alone and the number per surface area is limited.

Height is the distance between the base line (=surface of the tape) and the highest point of a pip. Half height is defined as the width of the pip at 50% of its height (W50) measured from the baseline. For the half height measurement the surface of the tape sample is taken as the baseline. Pip is referred herein above and below as a "particle protruding, from the surface of the tape". And thus the "half height of said particle protruding from the surface of the tape sample" as used herein in the description and claims is said half height width (W50).

The instrument was SSA-analysing instrument of Semyre Photonic Systems AB, Sweden. Service company is Padax AB, Sweden. New supplier is OCS gmbh in Germany.
Hardware: PC via Image Pre Processor
Software: NOPINIT
Camera type: spectrofotograph camera from Dalsa with 2048 pixels. It was on-line camera with line frequency of 5000.
Light source: intensity regulated red LED.
The width resolution of the pip (particle): 10 μm
The height resolution of the pip (particle): 1.5 μm
Tape speed in SSA-instrument: 50 mm/s The horizon of tape surface is created of a rotating metal shaft (FIG. 1: rod 2). The light source and camera are directly aligned with no angle with a focal point on the horizon.

The scanning results are for 1 m² area of tape and expressed as
number of particles per m² having a width larger than 150 μm at a half height of said particle protruding from the tape surface (=baseline),
number of particles per m² having a width larger than 200 μm at a half height of said particle protruding from the tape surface (=baseline), and
number of particles per m² having a width larger than 500 μm at a half height of said particle protruding from the tape surface (=baseline).

The given values represent an average number of particles obtained from 10 tape samples prepared and analysed for a semiconductive composition under determination.

It is believed that when using the above principles the SSA-method can be performed using another camera and set up-system provided the particle sizes given in description and claims can be detected and height at halfwidth determined with corresponding accuracy, would result in the same results as the above reference SSA-method.

Volume Resistivity (VR):

The VR was measured according to ISO 3915 using four-point method and tape samples consisting of the test polymer composition. The test tape was prepared herein as defined above under "Surface smoothness" test. The resistivity was measured using a conventional two electrode set-up, wherein the tape is arranged between the electrodes.

The volume resisitivity was calculated as follows:

$$\text{Volume Resistivity } (VR, ohm.\text{cm}) = \frac{R \times B \times D}{L}$$

wherein,
R=resistivity, ohm
B=breadth of tape, cm
D=thickness of tape, cm
L=distance between the two electrodes, cm.
In the method used herein the distance was L=2.54 cm The present invention will be further illustrated by means of the following examples:

Example 1

Semiconductive Polymer Composition of the Invention 61.70 wt % of conventional ethylene ethyl acrylate (EEA) copolymer produced in a high pressure via radical polymerisation, and having the following properties: $MFR_2$ of 6.0-9.0 g/10 min (ISO 1133, load 2.16, 190° C.), Ethyl acrylate (EA) comonomer content of 14.0-16.0 wt %, melt temperature of 110° C., density 928.0-932.0 kg/m³ (ASTM D792), was fed together with 0.80 wt % of commercially available antioxidant (polymerized 2,2,4-trimethyl-1,2-dihydroquinoline) to the first hopper of a Buss mixer, MDK/E 200, (commercial, supplier Buss). The polymer component was mixed under heating to a molten stage. The temperature profile in said mixer for this test was as follows measured from the molten polymer mixture: first section 104° C.; second section 117° C., third section 159° C., fourth section 201° C. en fifth section 208° C. The carbon black (b) used for preparing the semiconductive composition of this example was a commercially available furnace carbon black, having a tinting strength of 88-96% (ASTM D-3265), Iodine adsorption number of 150-170 mg/g (ASTM D-1510), Oil adsorption number of 106-116 ml/100 g (ASTM D-2414), mean primary particle size of 11-20 nm ((ASTM D-3849) and supplied by Cabot in a pellet form wherein more than 50 wt % of said carbon black pellets had an average agglomerate size of 0.250-0.500 μm, when determined using mesh sieving. The carbon black was added in two stages. First part of 27.50 wt % of the carbon black was fed to mixer before said second section of 117° C. and the rest, second part, of said carbon black 10.0 wt % before said third section of 159° C. The total throughput of the mixer was 1200 kg/hrs and the screw speed of the mixer was set at 121 rpm. Molten polymer mixture obtained from mixer was then transferred to commercial Berstorff extruder, available from Berstorff, which was operating as an integrated unit with said mixer to provide 150 bar pressure for filtering the molten polymer through a 150 μm mesh filter in a known manner. The operating temperature of in said extruder was approx. 165° C. After the filtration the polymer was pressed thorough an extrusion plate for forming pellets thereof in conventional manner. After pelletisation the pellets are dried and some of about 4 kg pellets are taken out for tape sample preparation for the SSA-analysis as defined above under Determination Methods in order to determine the surface smoothness of the obtained material.

Reference (comparative sample): was commercially available semiconductive composition based on ethylene ethyl acrylate polymer prepared by high pressure via radical polymerisation and sold under a grade name of LE5861 by Borealis. It had a $MFR_2$ of 5.0-7.0 dg/min (ISO 1133, load 2.16, 190°), Ethyl acrylate (EA) comonomer content of 13.5-16.0 wt %, melt temperature of 110° C., density 928.0-932.0 kg/m³ (ASTM D792). The compounding for producing said composition was effected in the same way as described in example 1 using the same amounts of polymer and same amounts and type of CB and antioxidant, except that all the CB was added at the same time in the above first addition step of CB.

Surface Smoothness Analysis (SSA-Test) Results:

The below given values represent the average values obtained from the measurements of 10 test samples made for both the reference material (comparative example) and for the example 1 of the semiconductive polymer material invention.
Reference Semiconductive Polymer Composition:

comprised less than (in average) 25.3 particles per m$^2$ having a width of larger than 150 μm at the half height of said particle protruding, and measured, from the tape surface as the base line, less than 7.2 particles per m$^2$ having a width of larger than 200 μm at the half height of said particle protruding, and measured, from the tape surface as the base line, and 0 particles per m$^2$ having a width of larger than 500 μm at the half height of said particle protruding, and measured, from the tape surface as the base line, when measured in accordance with the above under "Determination Methods" given SSA-analyses.

The Inventive Semiconductive Polymer Composition of Example 1:

comprised less than 5.4 particles per m$^2$ having a width of larger than 150 μm at the half height of said particle protruding, and measured, from the tape surface as the base line, having a particle size larger than 150 μm, less than 1.0 particles per m$^2$ having a width of larger than 200 μm at the half height of said particle protruding and measured from the tape surface as the base line, and 0 particles per m$^2$ having a width of larger than 500 μm at the half height of said particle protruding, and measured, from the tape surface as the base line, when measured in accordance with the above under "Determination Methods" given SSA-analyses.

The volume resistivity of the composition was 3.26 ohm.

Example 2

Semiconductive Polymer Composition of the Invention

The example 1 was repeated using the same polymer and CB in same amounts as in example 1 (the 0.8 wt % summing up to 10 wt % of the total mixture composed of conventional additives in conventional amounts), except that the temperatures in the 5 sections in mixer were: first section 105° C., second section 113° C., third section 168° C., fourth section 212° C., and in fifth section 216° C.;

the first part (27.50 wt %) of CB was fed in second section at 113° C. and the second part (10.0 wt %) in third section at 168° C.;

the operating temperature in said extruder was approx. 166° C.; and the mixer speed was 144 rpm.

Surface smoothness analysis as described above for example 2: 5.1 particles>150 μm, 1.3 particles>200 μm, 0 particles>500 μm Volume resistivity of the example 2 was 5.9

Example 3

Semiconductive Polymer Composition of the Invention

The example 1 was repeated using the same polymer and CB in same amounts as in example 1 (the 0.8 wt % summing up to 10 wt % of the total mixture composed of conventional additives in conventional amounts), except that the temperatures in the 5 sections in mixer were: first section 108° C., second section 120° C., third section 176° C., fourth section 225° C., and in fifth section 221° C.;

the first part (27.50 wt %) of CB was fed in second section at 120° C. and the second part (10.0 wt %) in third section at 176° C.; and the operating temperature in said extruder was approx. 170° C.

Surface smoothness analysis as described above for example 3: 5.7 particles>150 μm, 2.1 particles>200 μm, 0 particles>500 μm.

Volume resistivity of the example 3 was 5.7.

The test results show the markedly improved smoothness obtained with the semiconductive composition of the invention over the prior art reference. Moreover said semiconductive composition of the invention had good resistivity and was readily processable.

The examples provided above are only given for illustrating the present invention and are by no means intended to limit the scope of the present invention which is defined by the claims below.

The invention claimed is:

1. A semiconductive polymer composition, comprising:
   (a) from 30 to 90 wt % of a polymer component;
   (b) from 10 to 60 wt % of carbon black; and
   (c) from 0 to 8 wt % additives, based on the total semiconductive polymer composition, and wherein the composition comprises, when measured in accordance with the Surface Smoothness Analysis (SSA) method using a tape sample prepared by extrusion of said semiconductive polymer composition using a single screw extruder (20 mm), a screw speed of 50 rpm and extruder die opening of 30 mm×1 mm, the tape sample having a thickness of 500±20 μm and a width of 18 mm, in which method a measurement area of 1 m$^2$ of the tape surface is scanned with a camera while the tape moves with a speed of 50 mm/s,
      less than 23 particles per m$^2$ having a width of larger than 150 μm at the half height of said particle protruding from the surface of the tape sample, and
      less than 10 particles, per m$^2$ having a width of larger than 200 μm at the half height of said particle protruding from the surface of the tape sample.

2. The polymer composition according to claim 1, wherein the carbon black (b) has an STSA value of more that 30 m$^2$/g and less than 400 m$^2$/g.

3. The polymer composition according to claim 1, wherein the carbon black (b) has one or more of the following characteristics:
   a tinting strength of from 30 to 100,
   an iodine adsorption number of up to 300 g/kg,
   an Oil Absorption number of up to 300 cm$^3$/100 g.

4. The polymer composition as defined in claim 1, wherein said polymer component (a) is a polyolefin, preferably a polymer of an alpha-olefin which includes a homopolymer of ethylene or copolymer of ethylene with one or more comonomers, which polyethylene polymer is selected from:
   a branched (LDPE) polyethylene homo- or copolymer produced in high pressure by radical polymerization or a linear polyethylene homo- or copolymer produced by low pressure polymerization using a coordination catalyst;
   a LDPE homo- or copolymer which may optionally have an unsaturation that can preferably be provided by copolymerizing ethylene with at least one polyunsaturated comonomer as defined above and/or by using a chain transfer agent, such as propylene;
   a LDPE copolymer, wherein the comonomer is selected from one or more of polar comonomer(s) and may optionally comprise an unsaturation provided preferably by copolymerizing ethylene with at least one polyunsaturated comonomer(s) and/or by using a chain transfer agent, such as propylene; and/or a LDPE copolymer of ethylene with at least polar comonomer(s) which polar comonomer(s) is/are selected from:
vinyl carboxylate esters, such as vinyl acetate and vinyl pivalate, (meth)acrylates, such as methyl(meth)acrylate, ethyl(meth)acrylate, butyl(meth)acrylate and hydroxyethyl(meth)acrylate,
olefinically unsaturated carboxylic acids, such as (meth)acrylic acid, maleic acid and fumaric acid,
(meth)acrylic acid derivatives, such as (meth)acrylonitrile and (meth)acrylic amide, and/or
vinyl ethers, such as vinyl methyl ether and vinyl phenyl ether.

5. The polymer composition according to claim 1, wherein the $MFR_2$, is at least 0.01 g/10 min.

6. The polymer composition as defined in claim 1, which is in the form of polymer pellets.

7. The polymer composition as defined in claim 1, which is cross-linkable via radical reaction or via silane groups.

8. A process for preparing a semiconductive polymer composition, comprising the steps of:
i) introducing 30-90 wt % of a polymer component and 0-8 wt % additives in a mixer device and mixing the polymer component and additives at elevated temperature such that a polymer melt is obtained;
ii) adding 10-60 wt % of carbon black, preferably furnace carbon black, to the polymer melt and further mixing of the polymer melt such that the polymer composition comprises, when measured in accordance with the Surface Smoothness Analysis (SSA) method using a tape sample prepared by extrusion of said semiconductive polymer composition using a single screw extruder (20 mm), a screw speed of 50 rpm and extruder die opening of 30 mm×1 mm, the tape sample having a thickness of 500±20 μm and a width of 18 mm, in which method a measurement area of 1 $m^2$ of the tape surface is scanned with a camera while the tape moves with a speed of 50 mm/s,
less than 23 particles per $m^2$ having a width of larger than 150 μm at the half height of said particle protruding from the surface of the tape sample,
less than 10 particles per $m^2$ having a width of larger than 200 μm at the half height of said particle protruding from the surface of the tape sample, and preferably
about 0 particles per $m^2$ having a width of larger than 500 μm at the half height of said particle protruding from the surface of the tape sample.

9. The process according to claim 8, wherein the carbon black is added to the polymer melt in at least two subsequent addition steps, preferably in the first addition step at least ⅔ of the total amount of carbon black is added to the melt, and in the second addition step the remainder of the total amount of carbon black.

10. The process as defined in claim 8, which further comprises a step of pelletising the obtained polymer mixture.

11. The process as defined in claim 8, wherein in step (i), as said polymer component, the polymer component (a) is a polyolefin, preferably a polymer of an alpha-olefin which includes a homopolymer of ethylene or copolymer of ethylene with one or more comonomers, which polyethylene polymer is selected from:
a branched (LDPE) polyethylene homo- or copolymer produced in high pressure by radical polymerization or a linear polyethylene homo- or copolymer produced by low pressure polymerization using a coordination catalyst;
a LDPE homo- or copolymer which may optionally have an unsaturation that can preferably be provided by copolymerizing ethylene with at least one polyunsaturated comonomer as defined above and/or by using a chain transfer agent, such as propylene;
a LDPE copolymer, wherein the comonomer is selected from one or more of polar comonomer(s) and may optionally comprise an unsaturation provided preferably by copolymerizing ethylene with at least one polyunsaturated comonomer(s) and/or by using a chain transfer agent, such as propylene; and/or
a LDPE copolymer of ethylene with at least polar comonomer(s) which polar comonomer(s) is/are selected from:
vinyl carboxylate esters, such as vinyl acetate and vinyl pivalate, (meth)acrylates, such as methyl(meth)acrylate, ethyl(meth)acrylate, butyl(meth)acrylate and hydroxyethyl(meth)acrylate,
olefinically unsaturated carboxylic acids, such as (meth)acrylic acid, maleic acid and fumaric acid,
(meth)acrylic acid derivatives, such as (meth)acrylonitrile and (meth)acrylic amid, and/or
vinyl ethers, such as vinyl methyl ether and vinyl phenyl ether.

12. A semiconductive polymer composition or pellets thereof obtainable by the method according to claim 8.

13. A power cable comprising a conductor surrounded by one or more layers, wherein at least one of said one or more layers is a semiconductive layer, which comprises a semiconductive polymer composition according to claim 1.

14. A process for producing a power cable as defined in claim 13, wherein said process comprises blending the semiconductive polyolefin composition, above the melting point of at least the major polymer component(s) of the obtained mixture, and extruding the obtained melt mixture on a conductor for forming at least one semiconductive polymer layer on a conductor for a power cable.

15. A crosslinked power cable obtainable by the process according to claim 14.

16. The polymer composition according to claim 1, wherein the composition comprises about 0 particles per $m^2$ having a width of larger than 500 μm at the half height of said particle protruding from the surface of the tape sample.

17. The polymer composition according to claim 1, wherein the composition comprises less than 20 particles per $m^2$ having a width larger than 150 μm at the half height of said particle protruding from the surface of the tape sample, and/or less than 8 particles per $m^2$ having a width larger than 200 μm at the half height of said particle protruding from the surface of the tape sample.

18. The process according to claim 8, wherein the furnace carbon black (b) is supplied in the form of agglomerates, wherein at least 50 wt % of said agglomerates have an average pellet size of 0.250-0.500 μm.

19. The power cable according to claim 13, wherein the power cable comprises a conductor, an inner semiconductive layer (a), an insulation layer (b) and an outer semiconductive layer (c), each coated on the conductor in this order, wherein at least one of the inner and outer semiconductive layer(s) (a;c) comprises a semiconductive polymer composition according to claim 1.

20. The process according to claim 14, further comprising a step of crosslinking the cable by contacting said at least one semiconductive layer with a silane or peroxide crosslinking agent.

* * * * *